US008562744B2

(12) United States Patent
Wu

(10) Patent No.: US 8,562,744 B2
(45) Date of Patent: Oct. 22, 2013

(54) COATING DEVICE

(75) Inventor: Chia-Ying Wu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 537 days.

(21) Appl. No.: 12/967,000

(22) Filed: Dec. 13, 2010

(65) Prior Publication Data

US 2011/0247553 A1 Oct. 13, 2011

(30) Foreign Application Priority Data

Apr. 7, 2010 (TW) ................................ 99110660 A

(51) Int. Cl.
*C23C 16/00* (2006.01)
*C23F 1/00* (2006.01)
*H01L 21/306* (2006.01)

(52) U.S. Cl.
USPC ........... 118/719; 118/715; 118/728; 118/729; 118/730; 156/345.31; 156/345.32; 156/345.51; 156/345.54; 156/345.55

(58) Field of Classification Search
USPC ........ 118/715, 728–730; 156/345.31–345.32, 156/345.51, 345.54–345.55; 204/298.01, 204/298.15, 298.25
See application file for complete search history.

(56) References Cited

U.S. PATENT DOCUMENTS

| | | | | |
|---|---|---|---|---|
| 5,961,798 A * | 10/1999 | Robinson et al. | ........ | 204/298.25 |
| 6,045,667 A * | 4/2000 | Moll | ........................ | 204/192.38 |
| 8,430,998 B2 * | 4/2013 | Wang | ........................ | 204/298.15 |
| 8,506,772 B2 * | 8/2013 | Ling | ........................ | 204/298.15 |
| 2007/0098895 A1 * | 5/2007 | Smith | ........................ | 427/255.7 |
| 2009/0056630 A1 * | 3/2009 | Hester et al. | .................. | 118/730 |

* cited by examiner

*Primary Examiner* — Rakesh Dhingra
*Assistant Examiner* — Benjamin Kendall
(74) *Attorney, Agent, or Firm* — Altis & Wispro Law Group, Inc.

(57) ABSTRACT

A coating device includes two workspaces, two first slide rails, two second slide rails, two transporting loops, a number of rotating platforms, and a number of loading poles. The first slide rails are respectively fixed on the bottoms of the workspaces. The second slide rails are respectively fixed on the tops of the workspaces. The transporting loops are movably positioned on the first slide rails respectively. The rotating platforms are rotatably positioned on the transporting loops and capable of being driven by the transporting loops to rotate and slide along the first slide rails. The loading poles are positioned between the rotating platforms and the second slide rails, and are used for holding substrates. The loading poles are capable of being transported from one workspace to another workspace.

11 Claims, 6 Drawing Sheets

COATING DEVICE

BACKGROUND

1. Technical Field

The present disclosure relates to a coating device.

2. Description of Related Art

A typical dual-cavity coating device defines two workspaces. A number of substrates are loaded to a number of loading poles, which can be delivered between the two workspaces by a transporting device, and thus the substrates can be received in the two workspaces in turn to be coated with different films. The loading poles need to couple with a number of rotating platforms respectively received in the two workspaces, and thus the rotating platform can rotate the loading poles to guarantee the uniformity of the films. However, after the loading poles are delivered, it is difficult or time-consuming to align the loading poles with the rotating platforms.

Therefore, it is desirable to provide a coating device that can overcome the above-mentioned limitations.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
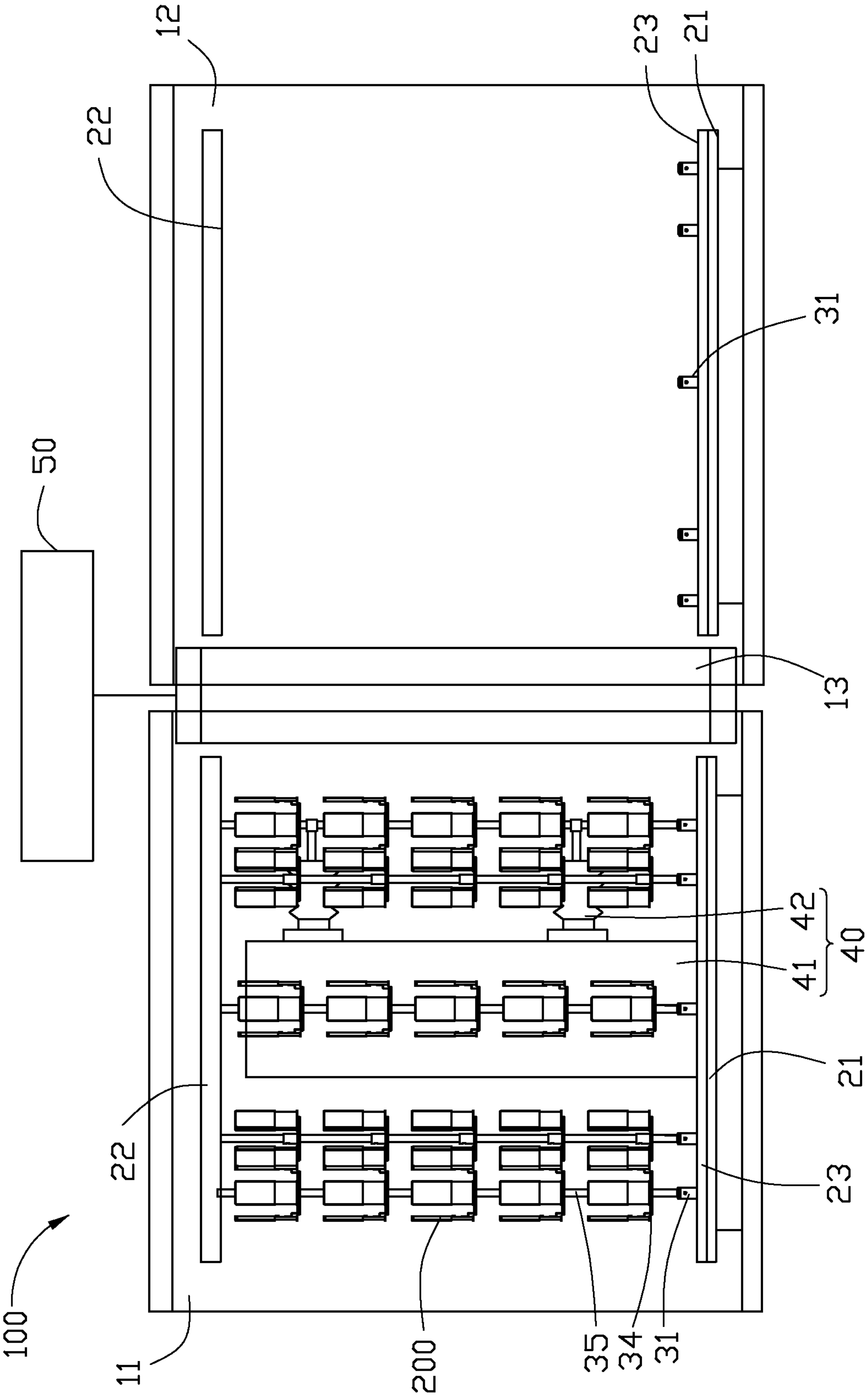
FIG. 1 is a schematic side view of a coating device, according to an exemplary embodiment.
Figure 2:
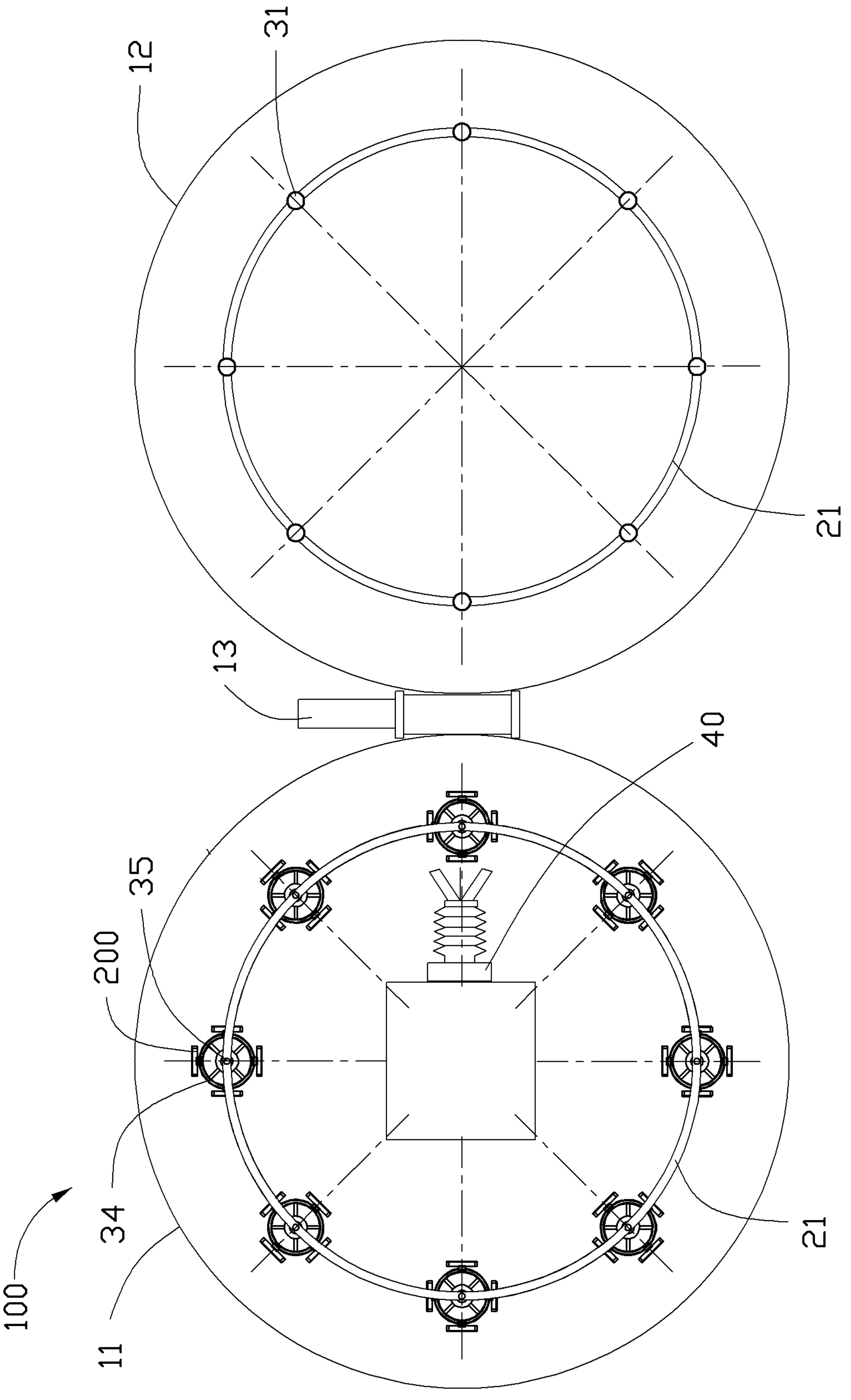
FIG. 2 is a top view of the coating device of FIG. 1.

Referring to FIGS. 1-2, a coating device 100 used for coating a number of substrates 200, includes a first workspace 11, a second workspace 12, a gate 13, two first slide rails 21, two second slide rails 22, two transporting loops 23, a number of rotating platforms 31, a number of fixing assemblies 34, a number of loading poles 35, a mechanical arm 40, and a controller 50.

The first and second workspaces 11 and 12 provide environments that are suitable for respectively coating different kinds of films on the substrates 200. The gate 13 separates the first and second workspaces 11 and 12 during the coating processes, and communicating the first and second workspaces 11 and 12 when one of the coating processes is finished.

The two first slide rails 21 are ring-shaped and respectively disposed on the bottom of the first and second workspaces 11, 12. The two second slide rails 22 are ring-shaped and respectively fixed on the top of the first and second workspaces 11, 12. Each first slide rail 21 coincides with a corresponding second slide rail 22. The two transporting loops 23 are movably disposed in the two first slide rails 21 and can respectively move along the two first slide rails 21 at a predetermined speed.

Figure 3:
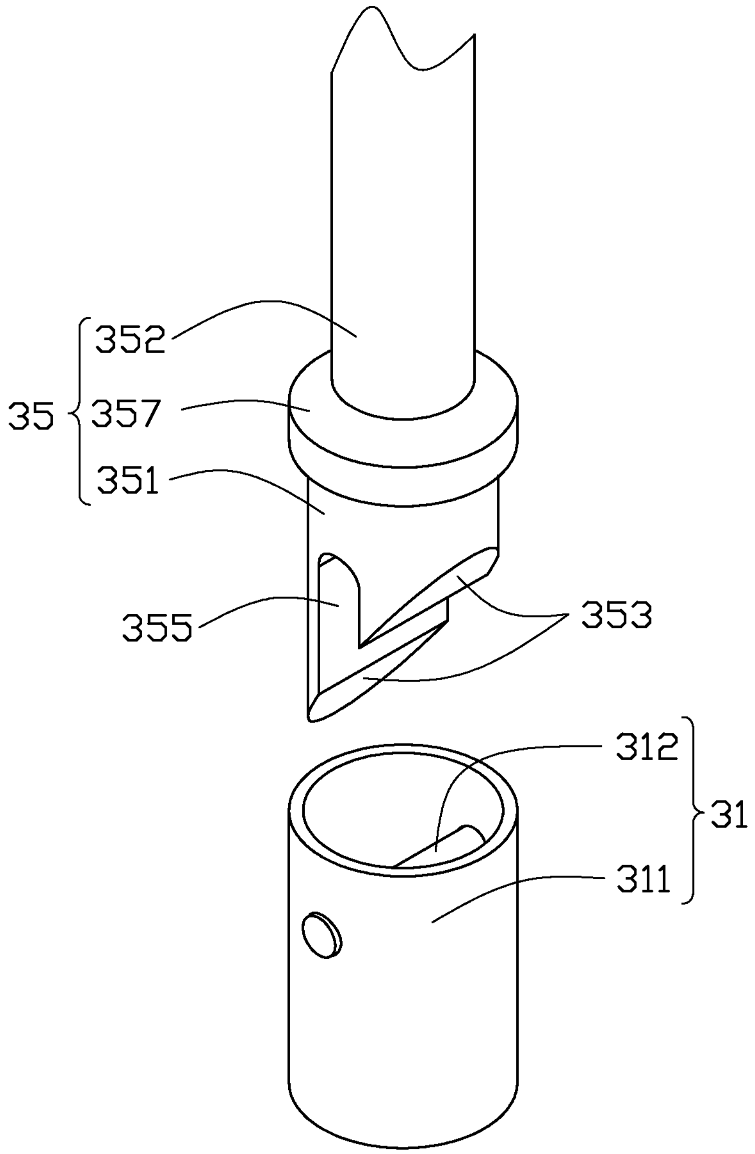
FIG. 3 is a schematic, isometric view of a rotating platform and a loading pole of the coating device of FIG. 1.

Also referring to FIG. 3, the rotating platforms 31 are rotatably disposed on the two transporting loops 23, and can be driven by the two transporting loops 23 to rotate and slide on and along the two first slide rails 21. The loading poles 35 are transported in the first and second workspaces 11, 12, and are coupled with the rotating platforms 31 in the first and second workspaces 11, 12 in turn.

Figure 4:
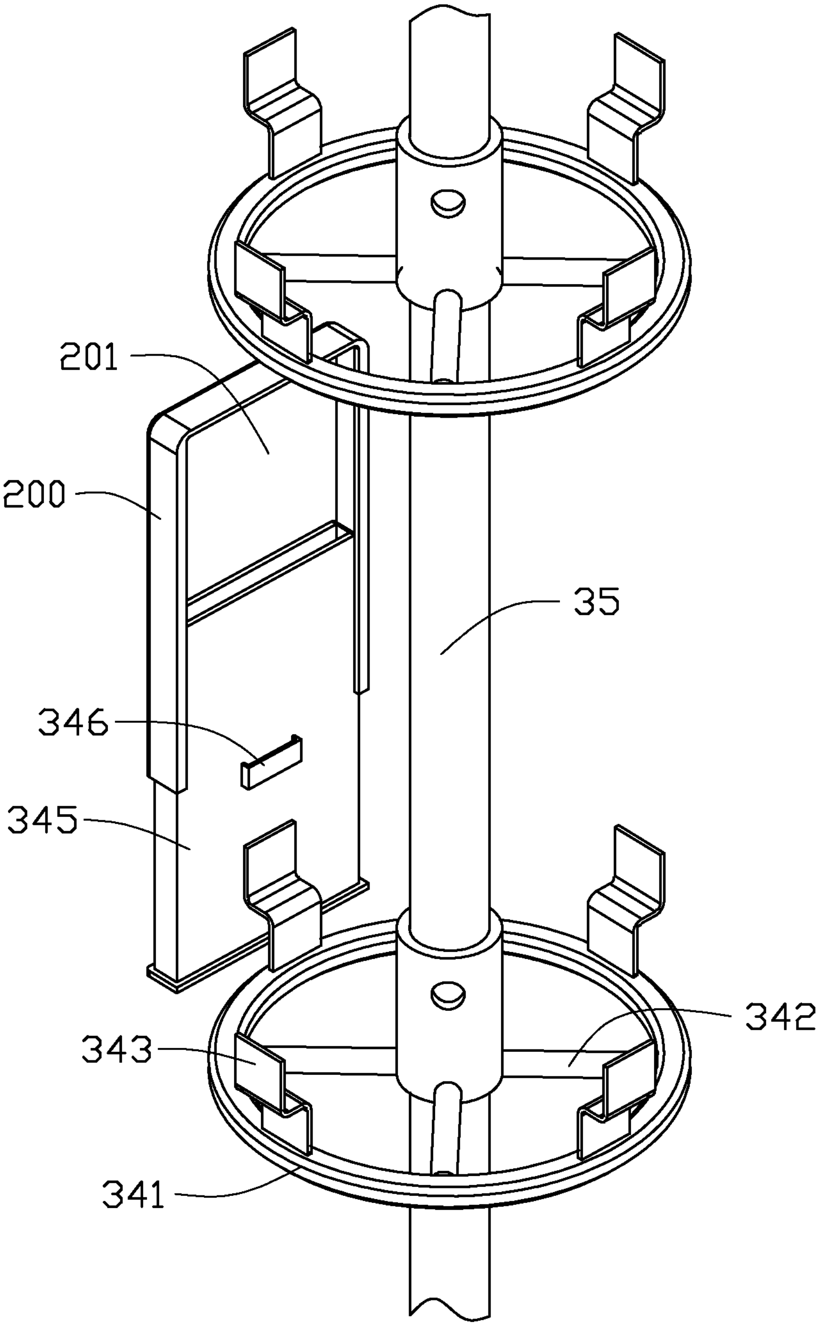
FIG. 4 is a schematic, isometric view of a fixing assembly of the coating device of FIG. 1.

Referring to FIG. 4, the fixing assemblies 34 sleeve over the loading poles 35 along the axis thereof for fixing the substrates 200, each fixing assembly 34 includes a fixing ring 341, a number of fixing poles 342, a number of pins 343, a number of cubic-shaped loading plates 345, and a number of inserting rings 346. The fixing poles 342 connect the fixing ring 341 to the loading pole 35 along the diameter direction of the fixing ring 341. The pins 343 are perpendicularly and upwardly fixed on the circumference of the fixing ring 341. The inserting rings 346 are fixed on the surfaces of the loading plates 345 facing the loading pole 35 respectively. Each pin 343 is inserted in a corresponding inserting ring 346 to fix the loading plate 345 on the fixing ring 341. In this embodiment, the substrate 200 is a shell of a mobile phone and defines a cubic-shaped receiving groove 201. The receiving groove 201 is interferingly fixed with the loading plate 345.

Figure 5:
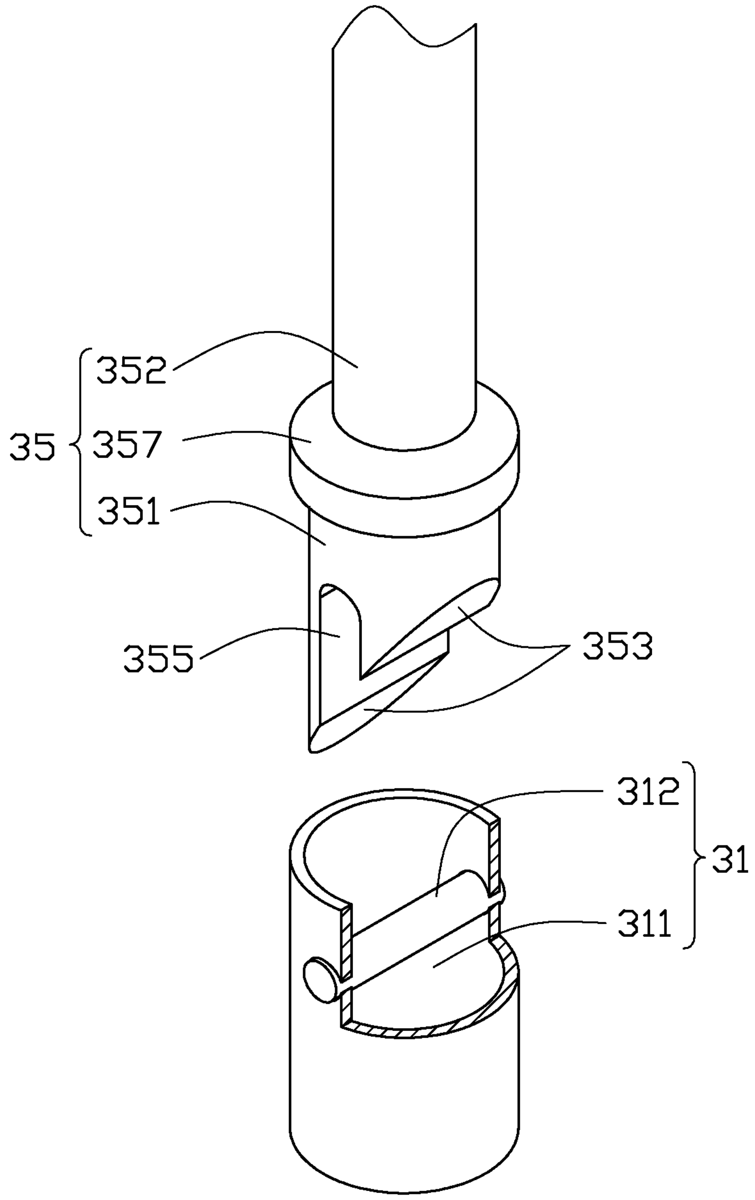
FIG. 5 is similar to FIG. 3, but showing a partially cut-away view of the rotating platform.
Figure 6:
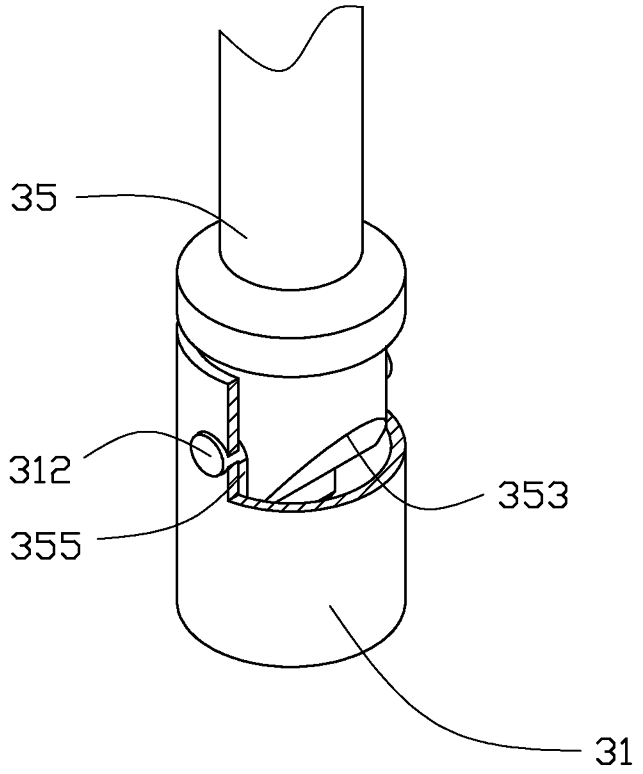
FIG. 6 is similar to FIG. 5, but showing an assembly view of the rotating platform and the loading pole.

Referring to FIGS. 5-6, each rotating platform 31 includes a tubular main body 311 and a rotating pin 312 rotatably received in the main body 311 along the diameter direction thereof. Each loading pole 35 includes a first end 351 and a second end 352 opposite to the first end 351. The first end 351 defines an ellipse-shaped slanted cutting surface 353. A slot 355 is defined on a minor axis of the cutting surface 353 and sunken along the axis direction of the loading pole 35 to the second end 352. When the first end 351 enters the main body 311, the cutting surface 353 is then slid on the rotating pin 312 to rotate the rotating pin 312 until the rotating pin 312 fits in the slot 355, which allows the loading pole 35 to couple with the rotating platform 31. Therefore, alignment becomes easier.

The second end 352 is slidably disposed in the second slide rail 22 and can rotate therein when the corresponding platform 31 rotates. When the first end 351 is aligned with the rotating platform 31, the loading pole 35 will move down to the tubular main body 311 of the rotating platform 31 due to the gravity.

The loading pole 35 further includes a ring-shaped flange 357 formed between the first end 351 and the second end 352, extending along the diameter direction of the loading pole 35. When the loading pole 35 is coupled with the rotating pin 312, the flange 357 resists on the main body 311 to avoid the whole mass of the loading pole 35 and the substrates 200 applying to the corresponding rotating pin 312.

Referring back to FIGS. 1 and 2, the mechanical arm 40 is disposed in the first workspace 11, and includes a base 41 and two arms 42. The two arms 42 can stretch out and retract relative to the base 41. When one loading pole 35 moves close to the gate 13, the gate 13 is opened to communicate with the first and second workspaces 11, 12. The arms 42 stretch out and lift the loading pole 35 to separate the loading pole 35 from the corresponding platform 31. Then they carry the loading pole 35 from the first workspace 11 to the second workspace 12 and make the loading pole 35 align with and extend into another rotating platform 31 adjacent to the gate 13 in the second workspace 12. The ellipse-shaped slanted cutting surface 353 pushes the rotating pin 312 to make the rotating pin 312 rotate, and the loading pole 35 is coupled with the rotating pin 312, then the arms 42 retract back to the first workspace 11 to carry the next loading pole 35. Then the gate 13 is closed.

The controller 50 is used for controlling the gate 13, the first and second sliding rails 21, 22, the transporting loops 23, and the mechanical arm 40.

In use, after the substrates 200 have completed the coating process in the first workspace 11. The controller 50 controls the gate 13 to open, the mechanical arm 40 carries one loading pole 35 from the first workspace 11 to the second work space 12 and makes the loading pole 35 couple with another rotating platform 31 in the second workspace 12. Then the transporting loop 23 in the first workspace 11 rotates to transport a next loading pole 35 to close to the gate 13, the transporting loop 23 in the second workspace 12 rotates to transport a next rotating platform 31 to close to the gate 13. The mechanical arm 40 carries the next loading pole 35 to the second workspace 12 until all loading poles 35 are transported to the second workspace 12 to couple with the rotating platforms 31 in the second workspace 12, and finally the gate 13 is closed.

In other embodiments, the number of the arms 42 can be one, the number of the first and second workspace 11, 12, can be more than one.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A coating device for coating a plurality of substrates, comprising:

a plurality of workspaces;

a plurality of first slide rails positioned on the bottoms of the workspaces respectively;

a plurality of second slide rails positioned on the tops of the workspaces respectively;

a plurality of transporting loops movably positioned on the first slide rails respectively;

a plurality of rotating platforms rotatably positioned on the transporting loops and capable of being driven by the transporting loops to rotate and slide along the first slide rails, each rotating platform comprising:

a tubular main body; and a rotating pin rotatably received in one end of the tubular main body along a diameter direction of the tubular main body; and a plurality of loading poles configured for loading the substrates, and capable of being delivered from one workspace to another workspace, each loading pole comprising:

a first end received in the main body of a corresponding rotating platform and defining a cutting surface;

a second end opposite to the first end and slidably positioned in a corresponding second slide rail and capable of rotating therein;

wherein a slot is defined in the cutting surface and receives the rotating pin of the corresponding rotating platform.

2. The coating device of claim 1, wherein the cutting surface is ellipse-shaped, the slot is defined on the minor axis of the cutting surface.

3. The coating device of claim 1, wherein each loading pole further comprises a ring-shaped flange between the first end and the second end, when the loading pole is coupled with the rotating pin of one rotating platform, the flange resists on the tubular main body of the rotating platform.

4. The coating device of claim 1, wherein the first and second slide rails are ring-shaped.

5. The coating device of claim 1, wherein the coating device further comprises a plurality of gates, each gate is configured for separating two adjacent workspaces during a coating process in one of the two adjacent workspaces and communicating the two adjacent workspaces after the coating process is completed.

6. The coating device of claim 1, wherein the coating device further comprises a mechanical arm positioned in one of the workspaces and configured for separating the loading poles from the rotating platforms that supports the loading poles and transporting the loading poles from one workspace to another workspace.

7. The coating device of claim 6, wherein the mechanical arm comprises a base and at least one arm connected to the base, the at least one arm is capable of stretching out and retracting relative to the base.

8. The coating device of claim 6, wherein the coating device further comprises a controller configured for controlling the mechanical arm, the first and second slide rails; when one gate between two adjacent workspaces opens, the mechanical arm carries one loading pole close to the gate in one of the two adjacent workspaces to couple with one rotating platform close to the gate in another one of the two adjacent workspaces, and the transporting loops in the two adjacent workspaces move to drive a next loading pole and a next platform to close to the gate respectively, the mechanical arm carries the next loading pole to couple with the next platform.

9. The coating device of claim 1, wherein the coating device further comprises a plurality of fixing assemblies configured for fixing the substrates on the loading poles, each fixing assembly comprises a fixing ring fixed on and sleeving over a corresponding loading pole, and a plurality of loading plates detachable positioned on the fixing ring and configured for supporting the substrates.

10. The coating device of claim 9, wherein the fixing assembly further comprises a plurality of fixing poles connecting the fixing ring to the corresponding loading pole along diameters of the fixing ring.

11. The coating device of claim 9, wherein the fixing assembly further comprises a plurality of pins perpendicular and upwardly positioned on the circumference of the fixing ring, and a plurality of inserting rings, each inserting ring is positioned on the surface of a corresponding loading plate facing the corresponding loading pole and is inserted by a corresponding pin to fix the corresponding loading plate on the fixing ring.

* * * * *